(12) United States Patent
Deml et al.

(10) Patent No.: US 7,675,781 B2
(45) Date of Patent: Mar. 9, 2010

(54) MEMORY DEVICE, METHOD FOR OPERATING A MEMORY DEVICE, AND APPARATUS FOR USE WITH A MEMORY DEVICE

(75) Inventors: Christoph Deml, Munich (DE); Edvin Paparisto, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/607,354

(22) Filed: Dec. 1, 2006

(65) Prior Publication Data

US 2008/0133849 A1    Jun. 5, 2008

(51) Int. Cl.
G11C 16/06    (2006.01)
(52) U.S. Cl. .................. 365/185.21; 365/185.25; 365/189.07; 365/189.09
(58) Field of Classification Search .......... 365/185.21, 365/185.25, 189.07, 189.09
See application file for complete search history.

(56) References Cited

U.S. PATENT DOCUMENTS

| | | | |
|---|---|---|---|
| 5,559,455 A * | 9/1996 | McPartland | 327/53 |
| 5,898,617 A * | 4/1999 | Bushey et al. | 365/185.2 |
| 5,999,454 A * | 12/1999 | Smith | 365/185.21 |
| 6,473,343 B2 | 10/2002 | Ohba et al. | |
| 7,123,509 B2 * | 10/2006 | Ohsawa | 365/184 |
| 2006/0187720 A1* | 8/2006 | Hanzawa et al. | 365/189.02 |

FOREIGN PATENT DOCUMENTS

DE    10357786 B3 *    5/2005

* cited by examiner

*Primary Examiner*—Hoai V Ho
*Assistant Examiner*—Fernando N Hidalgo
(74) *Attorney, Agent, or Firm*—Dicke, Billig & Czaja, PLLC

(57) ABSTRACT

A memory device, including a non-volatile memory device, a method for operating a memory device, and an apparatus for use with a memory device is disclosed. In one embodiment, the memory device includes at least one evaluation circuit for amplifying a signal resulting from the reading of a memory cell, and a device for precharging an output of the evaluation circuit to a predetermined voltage level.

25 Claims, 4 Drawing Sheets

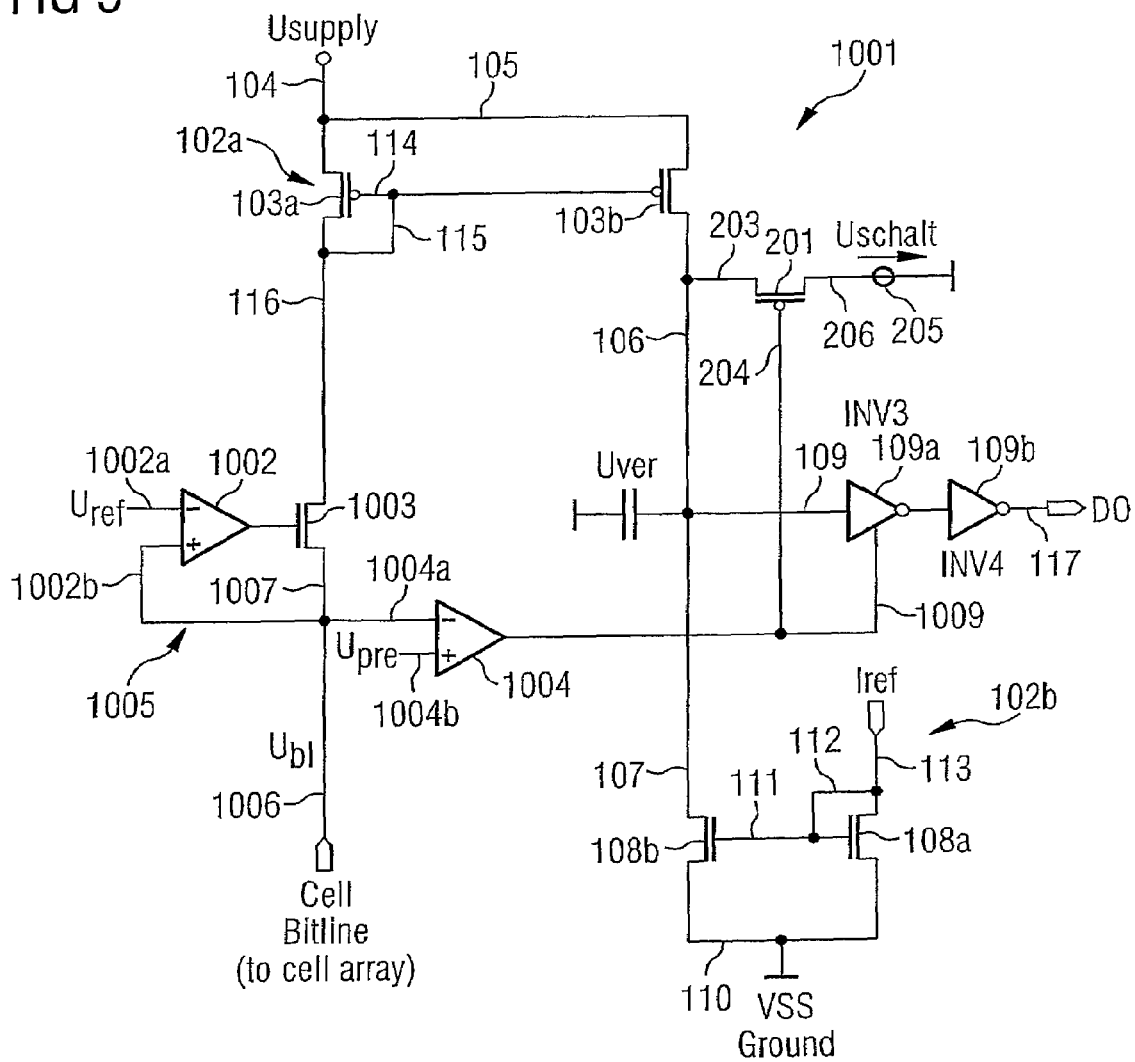

MEMORY DEVICE, METHOD FOR OPERATING A MEMORY DEVICE, AND APPARATUS FOR USE WITH A MEMORY DEVICE

BACKGROUND

The invention relates to a memory device, including a non-volatile memory device, a method for operating a memory device, and an apparatus for use with a memory device.

In the case of conventional memory devices, including conventional semiconductor memory devices, one differentiates between so-called functional memory devices (e.g. PLAs, PALs, etc.), and so-called table memory devices, e.g. ROM devices (ROM=Read Only Memory)—including PROMs, EPROMs, EEPROMs, flash memories, etc.—and RAM devices (RAM=Random Access Memory), e.g. DRAMs and SRAMs.

A RAM device is a memory for storing data under a predetermined address and for reading out the data under this address again later.

Since as many memory cells as possible are to be accommodated in a RAM device, one has been trying to realize them as simple as possible.

In the case of SRAMs (SRAM=Static Random Access Memory), the individual memory cells consist e.g. of few, for instance 6, transistors, and in the case of DRAMs (DRAM=Dynamic Random Access Memory) in general only of one single, correspondingly controlled capacitive element (e.g. a trench capacitor) with the capacitance of which one bit can be stored as charge.

This charge, however, remains for a short time only. Therefore, a so-called "refresh" must be performed regularly, e.g., approximately every 64 ms.

In contrast to that, no "refresh" has to be performed in the case of SRAMs, i.e., the data stored in the memory cells remains stored as long as an appropriate supply voltage is fed to a respective SRAM.

In the case of non-volatile memory devices (NVMs), e.g. EPROMs, EEPROMs, flash memories, OTPs, etc., however, the stored data remains stored even when the supply voltage is switched off.

The memory cells provided in the above-mentioned memory devices are each adapted to be connected to corresponding bit lines so as to transmit a data value to be read out from a memory cell or a data value to be written into a memory cell.

On reading out a memory cell, an access transistor connected with a memory cell is first of all connected through by the activation or selection, respectively, of a word line, and the charge state stored in the memory cell is applied to the bit line. Later, the weak signal coming from the memory cell is amplified by a sense amplifier/evaluated by an evaluator circuit, respectively.

In the sense amplifier/evaluator circuit, the read current (Icell) resulting from the reading of a memory cell e.g. may be compared with a reference current (Iref), e.g. by use of respective current mirror devices.

The current mirror devices, e.g., might be connected to a supply voltage (Usupply), and to ground (VSS, e.g., 0V).

Further, the output of the current mirror devices might be connected to respective inverters.

If the read current (Icell) is bigger than the reference current (Iref), a voltage (Uver) at the output of the current mirror devices, i.e., the input of the inverters, is driven to the value of the above supply voltage (Usupply). Hence, e.g., a "logic 1" is output at the output of the inverters.

If, however, the read current (Icell) is smaller than the reference current (Iref), the voltage (Uver) at the output of the current mirror devices, i.e., the input of the inverters, is driven to ground, e.g., 0V. Hence, e.g., a "logic 0" is output at the output of the inverters.

Prior to the reading out of the memory cell, the corresponding bit line is precharged to a predetermined voltage (Uref), e.g. by a so-called precharge circuit that is connected with the corresponding bit line.

This—due to the parasitic capacitances of the bit line—takes a certain time $t_1$ ("bit line charge time").

During the bit line charge time t1, the voltage (Uver) at the output of the current mirror devices—as becomes clear from the explanations above—either has the value of the supply voltage (Usupply), or has a value of 0V (ground).

When reading out the memory cell, the voltage (Uver) at the output of the current mirror devices—as also becomes clear from the explanations above, and depending on the result of the above comparison between the read current (Icell) and the reference current (Iref)—might change e.g. from the value of the supply voltage (Usupply) to ground, e.g., 0V, or vice versa, i.e., from ground, to the value of the supply voltage (Usupply).

The state of the inverters e.g. might change when the voltage (Uver) at the output of the current mirror devices reaches 0.5*Usupply. Alternatively, for safety reasons; measures might be taken that ensure that the state of the inverters does not change before the voltage (Uver) at the output of the current mirror devices reaches 0.25*Usupply or 0.75*Usupply, respectively.

To charge the input of the inverters to 0.25*Usupply or 0.75*Usupply, respectively—due to respective parasitic capacitances—again takes a certain time $t_2$ ("evaluation time").

Further, the above inverters lead to a respective additional delay $\tau_{gate\ delay}$ of the output signal ("gate delay time").

Hence, in total, the reading out of a memory cell might take a considerably long amount of time $t_1+t_2+\tau_{gate\ delay}$.

For these or other reasons, there is a need for the present invention.

SUMMARY

One embodiment provides a memory device having at least one evaluation circuit for amplifying a signal resulting from the reading of a memory cell, and a device for precharging an output of the evaluation circuit to a predetermined voltage level.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

FIG. 5 illustrates a more detailed view of an embodiment of the section of the memory device illustrated in FIG. 3, and a respective bit line precharge circuit.

DETAILED DESCRIPTION

In the following detailed description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

Figure 1:
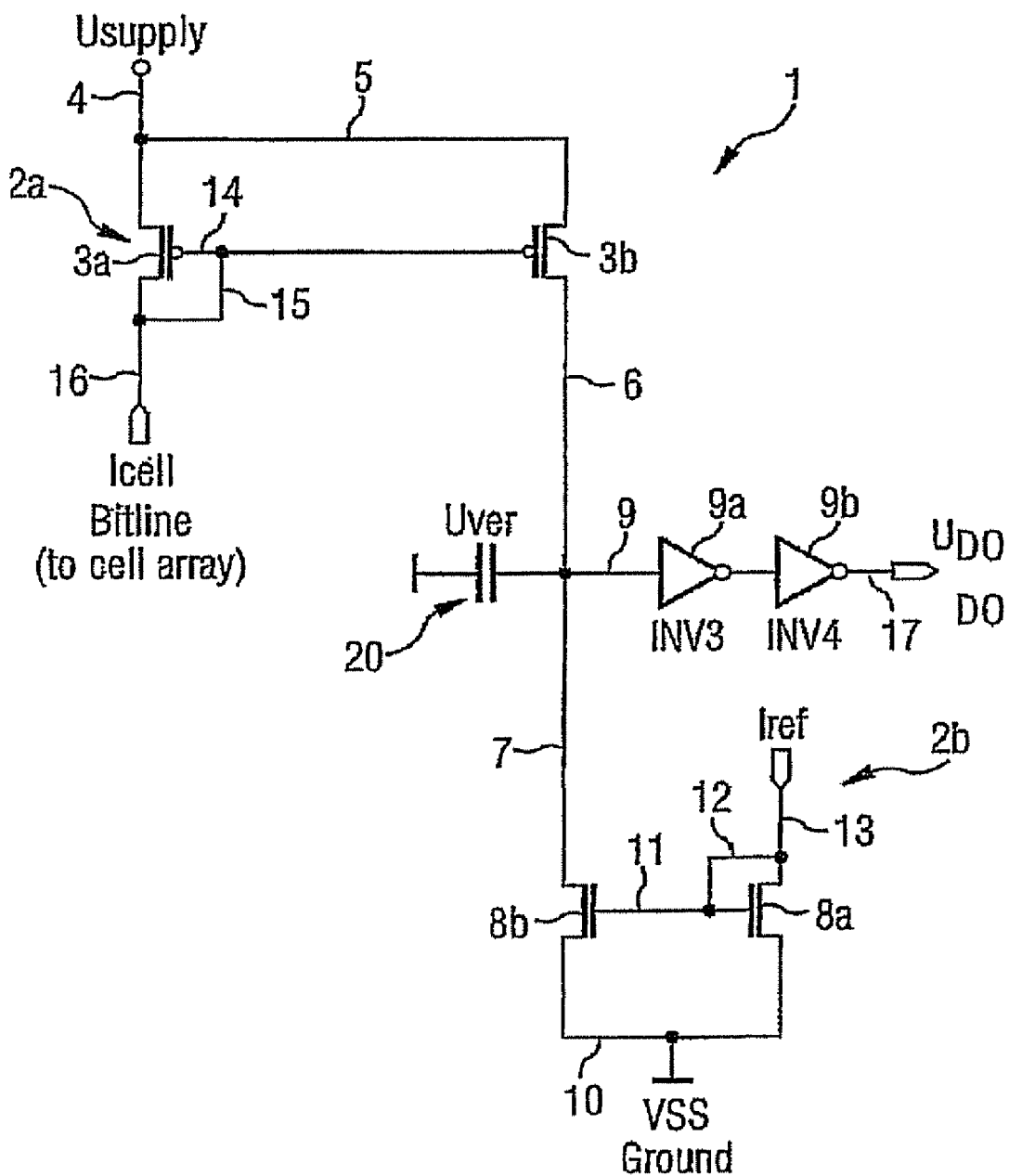
FIG. 1 illustrates a schematic representation of a section of a conventional memory device.

FIG. 1 illustrates a schematic representation of a section of a memory device 1, including elements used during the reading out of a memory cell of the memory device.

The memory device may for instance be a RAM device (RAM=Random Access Memory), e.g., a DRAM or SRAM, or a non-volatile memory device, e.g., a PROM, EPROM, EEPROM, flash memory, or OTP, etc.

As is illustrated in FIG. 1, the memory device 1 including a sense amplifier/evaluator circuit with two current mirror devices 2a, 2b.

The current mirror device 2a includes two transistors (two PMOS field-effect transistors 3a, 3b).

Correspondingly similar, the current mirror device 2b includes two transistors (here: two NMOS field-effect transistors 8a, 8b).

The source of the PMOS field-effect transistor 3a is connected via a line 4 to a supply voltage (Usupply), and via a line 5 to the source of the PMOS field-effect transistor 3b.

The drain of the PMOS field-effect transistor 3b is connected via lines 6, 7 to the drain of the NMOS field-effect transistor 8b, and via a line 9, which is used as an output of the current mirror devices 2a, 2b, to an input of an inverter 9a.

The output of the inverter 9a is connected to an input of a further inverter 9b, the output of which is connected to an output line 17.

The source of the NMOS field-effect transistor 8b is connected via a line 10 to ground (VSS, e.g., 0V), and to the source of the NMOS field-effect transistor 8a.

Further, the gate of the NMOS field-effect transistor 8b is connected via a line 11 to the gate of the NMOS field-effect transistor 8a, and via a line 12 to the drain of the NMOS field-effect transistor 8a, and to a line 13, to which as will be explained below a reference current (Iref) might be applied.

Correspondingly similar, the gate of the PMOS field-effect transistor 3b is connected via a line 14 to the gate of the PMOS field-effect transistor 3a, and via a line 15 to the drain of the PMOS field-effect transistor 3a, and to a line 16, which is connected or is connectable to a bit line, and to which as will be explained below—when reading out a respective memory cell—a read current (Icell) might be applied.

The memory device 1 may includes one or several memory cell arrays, each including a plurality of memory cells arranged in respective parallel rows and columns.

The memory cells provided in the above-mentioned memory cell arrays are each adapted to be connected to corresponding bit lines so as to transmit a data value to be read out from a memory cell or a data value to be written into a memory cell.

On reading out a memory cell, an access transistor connected with a memory cell is first of all connected through by the activation or selection, respectively, of a word line, and the charge state stored in the memory cell is applied to the bit line. Later, the weak signal coming from the bit line is amplified by the above evaluator circuit with the two current mirror devices 2a, 2b.

For this purpose, in the evaluator circuit with the two current mirror devices 2a, 2b, the read current (Icell) present on the line 16 connected/connectable with the bit line, resulting from the reading of a memory cell (and fed to the first current mirror device 2a, see explanations above, and FIG. 1) is compared with the reference current (Iref) present on the line 13 (fed to the second current mirror device 2b, see explanations above, and FIG. 1).

If the read current (Icell) is bigger than the reference current (Iref), a voltage (Uver) at the output 9 of the current mirror devices 2a, 2b, i.e., the input of the inverter 9a, is driven to the value of the above supply voltage (Usupply). Hence, e.g., a "logic 1" is output at the output line 17 connected with the output of the inverters 9a, 9b (or—alternatively—a "logic 0").

If, however, the read current (Icell) is smaller than the reference current (Iref), the voltage (Uver) at the output 9 of the current mirror devices 2a, 2b, i.e., the input of the inverter 9a, is driven to ground, e.g., 0V. Hence, e.g., a "logic 0" is output at the output line 17 connected with the output of the inverters 9a, 9b (or—alternatively—a "logic 1").

Figure 2:
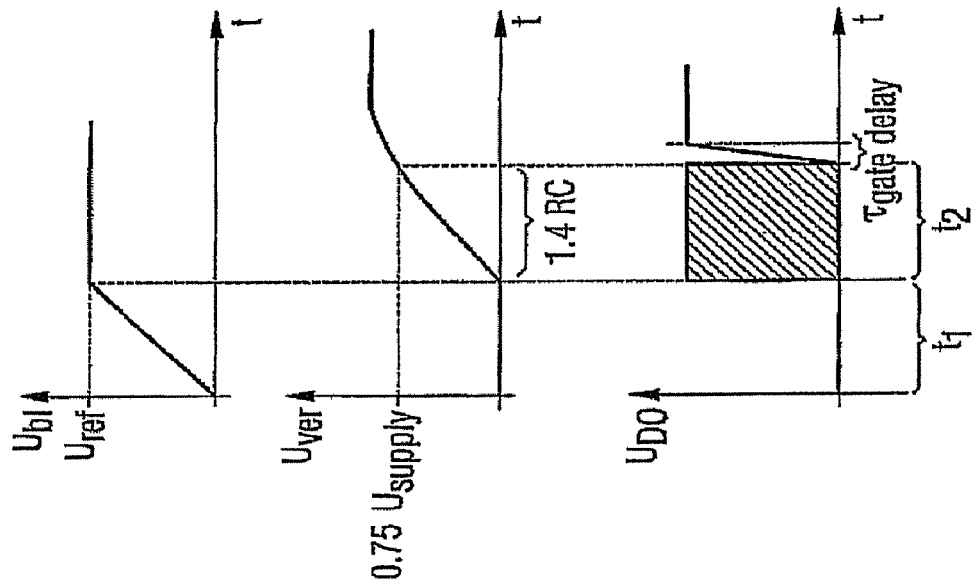
FIG. 2 is a signal diagram illustrating the time course of a plurality of voltages occurring during the reading out of a memory cell in the memory device illustrated in FIG. 1.

Prior to the reading out of the memory cell, and as is illustrated in FIG. 2, the voltage (Ubl) present on the corresponding bit line is precharged to a predetermined voltage (Uref), e.g. by a so-called precharge circuit that is connected with the corresponding bit line. This—due to the parasitic capacitances of the bit line, and as is illustrated in FIG. 2—takes a certain time $t_1$ ("bit line charge time"). During the bit line charge time t1, the voltage (Uver) at the output 9 of the current mirror devices 2a, 2b—as becomes clear from the explanations above—either has the value of the supply voltage (Usupply), or has a value of 0V.

When reading out the memory cell, the voltage (Uver) at the output 9 of the current mirror devices 2a, 2b—as also becomes clear from the explanations above, and depending on the result of the above comparison between the read current (Icell) and the reference current (Iref)—might change e.g. from the value of the supply voltage (Usupply) to ground, e.g., 0V, or vice versa, i.e., from ground, to the value of the supply voltage (Usupply).

The state of the inverters 9a, 9b connected with the output 9 of the current mirror devices 2a, 2b e.g. might change when the voltage (Uver) at the output 9 of the current mirror devices 2a, 2b reaches 0.5*Usupply. Alternatively, for safety reasons, measures might be taken that ensure that the state of the inverters 9a, 9b does not change before the voltage (Uver) at the output 9 of the current mirror devices 2a, 2b reaches 0.25*Usupply or 0.75*Usupply, respectively (see FIG. 2). For this purpose, e.g. a Schmitt-Trigger might be used (instead of or in addition to the inverters 9a, 9b). Additionally or alternatively, for example, a Flip-Flop may be used connected with the output line 17, which is evaluated after a predetermined "safety time", only.

To charge the input of the inverters 9a, 9a/Schmitt Trigger to 0.25*Usupply or 0.75*Usupply, respectively—due to respective parasitic capacitances 20 e.g. of the lines 6, 7, 9, the transistors 3b, 8b, the inverter 9a, etc.—again takes a certain time $t_2$ ("evaluation time") (in the present case, approximately 1.4 RC). Further—as also illustrated in FIG. 2—the above inverters 9a, 9b lead to a respective additional delay $\tau_{gate\ delay}$ ("gate delay time") of the output signal, i.e., a voltage $U_{DO}$ output at the output line 17. Hence, in total, the reading out of a memory cell might take a considerably long amount of time $t_1 + t_2 + \tau_{gate\ delay}$.

Figure 3:
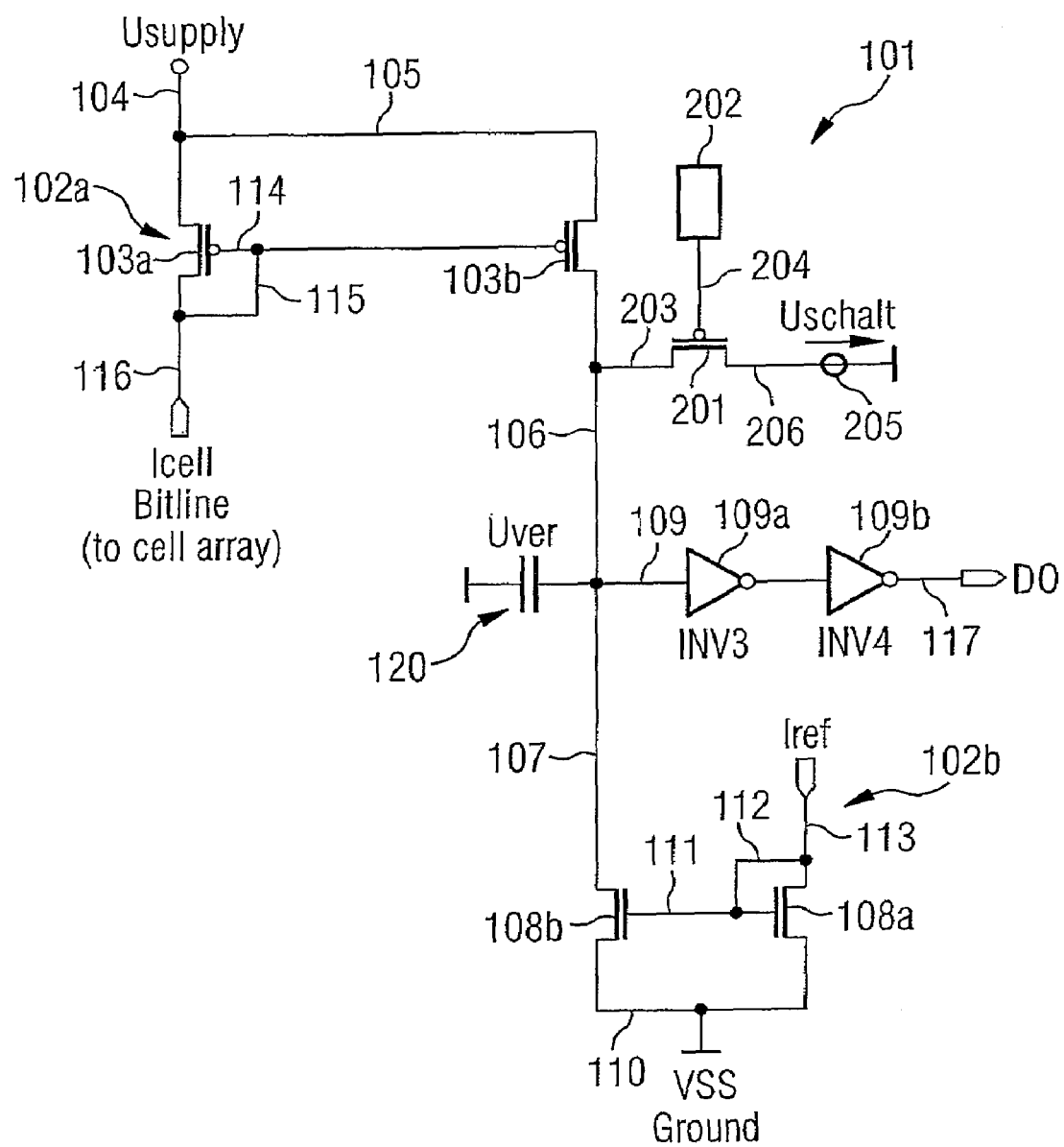
FIG. 3 illustrates a schematic representation of a section of a memory device in accordance with an embodiment of the invention.

FIG. 3 illustrates a schematic representation of a section of a memory device 101 in accordance with an embodiment of the invention, including elements used during the reading out of a memory cell of the memory device.

The memory device may for instance be a RAM device (RAM=Random Access Memory), e.g., a DRAM or SRAM, or a non-volatile memory device, e.g. a PROM, EPROM, EEPROM, flash memory, or OTP, etc.

As is illustrated in FIG. 3, the memory device 101 including a sense amplifier/evaluator circuit with two current mirror devices 102a, 102b (and a plurality of additional sense amplifiers/evaluator circuits, constructed identically or similarly as the evaluator circuit illustrated in FIG. 3).

The current mirror device 102a includes two transistors (here: two PMOS field-effect transistors 103a, 103b).

Correspondingly similar, the current mirror device 102b includes two transistors (here: two NMOS field-effect transistors 108a, 108b).

In one embodiment, instead of the PMOS field-effect transistors 103a, 103b, respective NMOS field-effect transistors could be used, and—correspondingly—instead of the NMOS field-effect transistors 108a, 108b, respective PMOS field-effect transistors, etc. (e.g., in the case of a negative supply voltage Usupply (see below)).

The source of the PMOS field-effect transistor 103a is connected via a line 104 to a supply voltage (Usupply), and via a line 105 to the source of the PMOS field-effect transistor 103b.

The drain of the PMOS field-effect transistor 103b is connected via lines 106, 107 to the drain of the NMOS field-effect transistor 108b, and via a line 109, which is used as an output of the current mirror devices 102a, 102b, to an input of an inverter 109a.

Further, as will be explained in greater detail below, the drain of the PMOS field-effect transistor 103b (and hence, the lines 106, 107, 109, and the drain of the NMOS field-effect transistor 108b, as well as the input of the inverter 109a) in addition via a line 203 is connected to a switching device 201.

As a switching device 201, e.g., a transistor may be used (here: a PMOS field-effect transistor (alternatively, e.g., a NMOS field-effect transistor)), or e.g. a transmission gate, etc.

In one embodiment, the above line 203, i.e., the lines 106, 107, 109, the transistors 103b, 108b, and the inverter 109a may be connected to the source-drain path of the transistor 201 (here: the source of the PMOS field-effect transistor (or alternatively, the drain of a respective NMOS field-effect transistor)).

A control input of the switching device 201 (here: the gate of the PMOS field-effect transistor 201) is connected via a control line 204 to a control device 202 (here: an evaluator circuit output precharge control device 202).

As is further illustrated in FIG. 3, the switching device 201 via a line 206 in addition is connected to a voltage supply 205, providing a constant voltage of Uschalt.

The above line 206, i.e., the voltage supply 205 may be connected to the source-drain path of the transistor 201 (here: the drain of the PMOS field-effect transistor (or alternatively, the source of a respective NMOS field-effect transistor)).

The voltage Uschalt provided by the voltage supply 205 may e.g. be approximately 0.5*Usupply, i.e., approximately half the supply voltage Usupply to which the first current mirror device 102a is connected (and/or e.g. half of the sum of the supply voltage Usupply and the ground voltage VSS (see below)).

As will be described in further detail below, when the control device 202 brings the control line 204 in a first state (e.g., "logic 0" (or—alternatively—"logic 1")), the switching device 201/transistor 201 is activated/switched on, such that the voltage supply 205—and hence, the voltage Uschalt—is electrically conductively coupled to the line 203.

Further, as also will be described in further detail below, when the control device 202 brings the control line 204 in a second state, different from the first state (e.g., "logic 1" (or—alternatively—"logic 0")), the switching device 201/transistor 201 is deactivated/switched off, such that the voltage supply 205—and hence, the voltage Uschalt—is decoupled from the line 203 (i.e., no conductive connection is provided between the voltage supply 205, and the line 203).

As is further illustrated in FIG. 3, the output of the inverter 109a is connected to an input of a further inverter 109b, the output of which is connected to an output line 117.

Alternatively, more or less than two inverters may be provided, e.g., one single inverter (or no inverters at all).

The source of the NMOS field-effect transistor 108b is connected via a line 110 to ground (i.e., to the above ground voltage VSS, e.g., 0V), and to the source of the NMOS field-effect transistor 108a.

Further, the gate of the NMOS field-effect transistor 108b is connected via a line 111 to the gate of the NMOS field-effect transistor 108a, and via a line 112 to the drain of the NMOS field-effect transistor 108a, and to a line 113, to which as will be explained below a reference current (Iref) might be applied.

Correspondingly similar, the gate of the PMOS field-effect transistor 103b is connected via a line 114 to the gate of the PMOS field-effect transistor 103a, and via a line 115 to the drain of the PMOS field-effect transistor 103a, and to a line 116, which is connected or is connectable to a bit line, and to which as will be explained below—when reading out a respective memory cell—a read current (Icell) might be applied.

The memory device 101 may include one or several memory cell arrays, each including a plurality of memory cells arranged in respective parallel rows and columns.

The memory cells provided in the above-mentioned memory cell arrays are each adapted to be connected to corresponding bit lines so as to transmit a data value to be read out from a memory cell or a data value to written into a memory cell.

On reading out a memory cell, an access transistor connected with the memory cell is first of all connected through by the activation or selection, respectively, of a word line, and the charge state stored in the memory cell is applied to the bit line. Later, the weak signal coming from the bit line is amplified by the above evaluator circuit with the two current mirror devices 102a, 102b.

For this purpose, in the evaluator circuit with the two current mirror devices 102a, 102b, the read current (Icell) present on the line 116 connected/connectable with the bit line, resulting from the reading of a memory cell (and fed to the first current mirror device 102a, see explanations above, and FIG. 3) is compared with the reference current (Iref) present on the line 113 (fed to the second current mirror device 102b, see explanations above, and FIG. 3).

If the read current (Icell) is bigger than the reference current (Iref), a voltage (Uver) at the output 109 of the current mirror devices 102a, 102b, i.e., the input of the inverter 109a, is driven to the value of the above supply voltage (Usupply). Hence, e.g., a "logic 1" is output at the output line 117 connected with the output of the inverters 109a, 109b (or—alternatively—a "logic 0").

If, however, the read current (Icell) is smaller than the reference current (Iref), the voltage (Uver) at the output 109 of the current mirror devices 102a, 102b, i.e., the input of the inverter 109a, is driven to ground, e.g., 0V. Hence, e.g., a "logic 0" is output at the output line 117 connected with the output of the inverters 109a, 109b (or—alternatively—a "logic 1").

Figure 4:
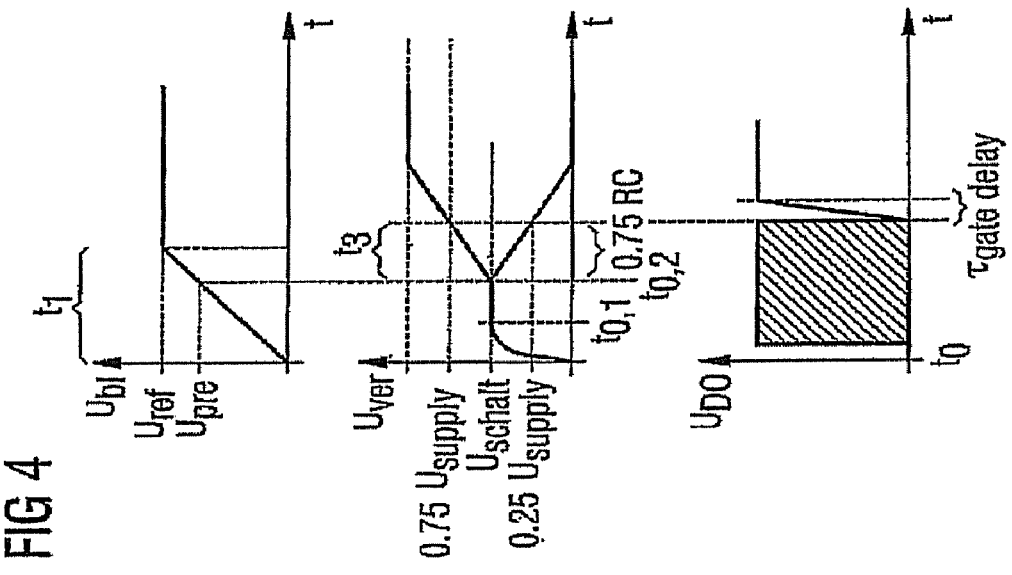
FIG. 4 illustrates a signal diagram illustrating the time course of a plurality of voltages occurring during the reading out of a memory cell in the memory device illustrated in FIG. 2.

Prior to the reading out of the memory cell, e.g., starting at a time $t_0$ illustrated in FIG. 4, the voltage (Ubl) present on the corresponding bit line is precharged to a predetermined voltage (Uref), e.g. by a respective precharge circuit that is connected with the corresponding bit line. This—due to the parasitic capacitances of the bit line, and as is illustrated in FIG. 4—takes a certain time $t_1$ ("bit line charge time").

Starting, e.g., in parallel to the above precharging of the bit line to the above predetermined voltage (Uref) (e.g., also e.g. starting at the above time $t_0$)—and hence, as illustrated in FIG. 4, also prior to reading out the memory cell, and while the above bit line is charged—the control device 202 brings the control line 204 from the above second to the above first state (e.g., "logic 0" (or—alternatively—"logic 1"), such that the switching device 201/transistor 201 is activated/switched on, and the voltage supply 205—and therefore, the voltage Uschalt—is electrically conductively coupled to the line 203.

Hence, as is illustrated in FIG. 4, the voltage (Uver) at the output 109 of the current mirror devices 102a, 102b—which as becomes clear from the explanations above at the above time $t_0$ either has the value of the supply voltage (Usupply), or a value of 0V (ground)—is charged to the above voltage Uschalt provided by the voltage supply 205, i.e., approximately 0.5*Usupply ("output precharge voltage").

As is illustrated in FIG. 4, the voltage (Uver) at the output 109 of the current mirror devices 102a, 102b reaches the above value 0.5*Usupply (output precharge voltage) at a time $t_{0,1}$, i.e., before the bit line is precharged to the above predetermined bit line precharge voltage (Uref), and hence, before the time $t_1$ ("bit line charge time").

As is further illustrated in FIG. 4, and as will be described in further detail below, e.g., when the voltage at the bit line reaches a certain, further predetermined value (Upre), and/or e.g. starting at a time $t_{0,2}$—after the time $t_{0,1}$ at which the output 109 of the current mirror devices 102a, 102b reaches the above value 0.5*Usupply (output precharge voltage), and before or short before or when the bit line is precharged to the above predetermined bit line precharge voltage (Uref), i.e., before or short before or after the time $t_1$ ("bit line charge time"), the control device 202 brings the control line 204 from the above first state back to the above second state (e.g., "logic 1" (or—alternatively—"logic 0")). Hence, the switching device 201/transistor 201 is deactivated/switched off, and the voltage supply 205—and therefore, the voltage Uschalt—is decoupled from the line 203.

The above further, predetermined value Upre e.g. might be chosen such that it is e.g. just a little bit smaller, than the value of the bit line precharge voltage Uref. For instance, Upre might be chosen such that it is between 0.8*Uref and 0.99*Uref, or for instance, between 0.9*Uref and 0.95*Uref, etc., etc.

When the bit line was precharged to the above predetermined bit line precharge voltage (Uref), i.e., at the above time $t_1$ ("bit line charge time")—or even before, e.g., at the above time $t_{0,2}$, or between the above times $t_{0,2}$ and $t_1$, etc.—the evaluation/reading out of the memory cell is started.

Hence, the voltage (Uver) at the output 109 of the current mirror devices 102a, 102b—corresponding to the explanations above, and depending on the result of the above comparison between the read current (Icell) and the reference current (Iref)—then changes from the above value 0.5*Usupply (output precharge voltage) (reached at the above time $t_{0,2}$ already) to ground, e.g., 0V, or to the value of the supply voltage (Usupply).

Correspondingly similar as was explained above in connection with FIG. 1, the state of the inverters 109a, 109b connected with the output 109 of the current mirror devices 102a, 102b e.g. might change when the voltage (Uver) at the output 109 of the current mirror devices 102a, 102b reaches 0.5*Usupply. Alternatively, for safety reasons, measures might be taken that ensure that the state of the inverters 109a, 109b does not change before the voltage (Uver) at the output 109 of the current mirror devices 102a, 102b reaches 0.25*Usupply or 0.75*Usupply, respectively (see FIG. 4). For this purpose, e.g. a Schmitt-Trigger might be used (instead of or in addition to the inverters 109a, 109b). Additionally or alternatively, for example, a Flip-Flop may be used connected with the output line 117, which is evaluated after a predetermined "safety time", only.

In one embodiment of the memory device 101 illustrated in FIG. 3, the time $t_3$—illustrated in FIG. 4—that is necessary to charge the input of the inverters 109a, 109b to 0.25*Usupply or 0.75*Usupply, respectively is smaller, than the above "evaluation time" $t_2$—illustrated in FIG. 2—in the memory device 1 illustrated in FIG. 1 (even though respective parasitic capacitances 120 e.g. of the lines 106, 107, 109, the transistors 103b, 108b, and the inverter 109a of the memory device 101 of FIG. 3 might be correspondingly similar as the respective parasitic capacitances 20 caused, e.g., by the lines 6, 7, 9, the transistors 3b, 8b, and the inverter 9a of the memory device 1 illustrated in FIG. 1).

The reason is that due to the above precharge of the output 109 of the current mirror devices 102a, 102b to the above value 0.5*Usupply (output precharge voltage) the output 109 of the current mirror devices 102a, 102b in the memory device 101 illustrated in FIG. 3 needs only to change from the above value 0.5*Usupply (output precharge voltage) to 0.25*Usupply or 0.75*Usupply, respectively (and not from 0V to 0.75*Usupply, or Usupply to 0.25*Usupply, respectively, as is the case in the memory device 1 illustrated in FIG. 1).

Hence, as illustrated in FIG. 4, in the memory device 101 illustrated in FIG. 3, the above time $t_3$ that is necessary to charge the input of the inverters 109a, 109a from 0.5*Usupply to 0.25*Usupply or 0.75*Usupply may e.g. only be approximately 0.75 RC (while in the memory device 1 illustrated in FIG. 1, as mentioned above, the "evaluation time" $t_2$ e.g. may be approximately 1.4 RC).

In the memory device 101 illustrated in FIG. 3, correspondingly similar as is the case in the memory device 1 illustrated in FIG. 1, the above inverters 109a, 109b lead to a respective additional delay $\tau_{gate\ delay}$ ("gate delay time") of the output signal, i.e., a voltage $U_{DO}$ output at the output line 117 of the memory device 101 (see FIG. 4). However, as the time $t_3$ that is necessary to charge the input of the inverters 109a, 109a from 0.5*Usupply to 0.25*Usupply or 0.75*Usupply as explained above in the memory device illustrated in FIG. 3 is considerably smaller, than the "evaluation time" $t_2$ in the memory device 1 illustrated in FIG. 1, and as also from a respective comparison of the FIGS. 2 and 4, the reading out of a memory cell in the memory device 101 is considerably faster, than in the memory device 1 (and e.g. might only take the amount of time $t_1+t_3+\tau_{gate\ delay}$ (or less), versus $t_1+t_2+\tau_{gate\ delay}$ as is the case in the memory device 1).

FIG. 5 illustrates a more detailed view of an embodiment of the section of the memory device 101 illustrated in FIG. 3, and a respective bit line precharge circuit 1005, coupled to the line 116 of the memory device 101, and connected or connectable with the corresponding bit line.

In one embodiment illustrated in FIG. 5, the bit line precharge circuit 1005—mentioned with respect to FIG. 3, already, and used to charge the voltage (Ubl) present on the corresponding bit line to the above predetermined voltage (Uref) during the above bit line charge time $t_1$—comprises an operational amplifier 1002, and a transistor 1003, e.g. a respective NMOS field-effect transistor (or, alternatively, a PMOS field-effect transistor, etc.).

The drain-source path of the transistor 1003 (in particular, the drain of the NMOS field-effect transistor) is connected to the above line 116, i.e., the drain and gate of the PMOS field-effect transistor 103a, and the gate of the PMOS field-effect transistor 103b.

Further, a gate of the NMOS field-effect transistor 1003 is connected to the output of the operational amplifier 1002.

A first input of the operational amplifier 1002 (e.g., a minus-input thereof) is connected to a line 1002a, to which a constant voltage with the value of the above predetermined voltage Uref might be applied.

As is further illustrated in FIG. 5, the respective bit line is connected or connectable to a line 1006, which is connected via a line 1002b to a second input of the operational amplifier 1002 (e.g., a plus-input thereof), via a line 1007 to the source-drain path of the transistor 1003 (to the source of the respective NMOS field-effect transistor 1003), and—as will be described in further detail below—via a line 1004a to a first input of an additional operational amplifier 1004 (e.g., a minus-input thereof).

By the operational amplifier 1002, and the transistor 1003—correspondingly similar as in conventional memory devices—the value of the voltage present on the line 1006—and hence, the bit line, i.e., the above bit line voltage Ubl (after connection of the bit line with the line 1006, e.g. by use of a further transistor (not illustrated))—is regulated/precharged to the above value Uref (bit line charge time $t_1$, see FIG. 4).

In the specific embodiment illustrated in FIG. 5, the above additional operational amplifier 1004 functions as "switching control device 202" (illustrated in FIG. 3).

As is illustrated in FIG. 5, a second input of the additional operational amplifier 1004 (e.g., a plus-input thereof) is connected to a line 1004b, to which a constant voltage with the value of the above further, predetermined voltage Upre might be applied.

The output of the additional operational amplifier 1004 is connected via a line 1008 with the control line 204 (i.e., the gate of the transistor 201), and—as will be described below—via the line 1008, and a line 1009 to a control input of the inverter 109a.

In the additional operational amplifier 1004, the voltage present on the lines 1006, 1004a—and hence, the bit line, i.e., the bit line voltage Ubl (after connection of the bit line with the line 1006, see above)—is compared with the further, predetermined voltage Upre present on line 1004b.

As is illustrated in FIG. 4, at the beginning of the above bit line charge time $t_1$, the value of the bit line voltage Ubl is still smaller, than the value of the further, predetermined voltage Upre present on line 1004b.

Therefore, the output of the additional operational amplifier 1004—and therefore, also the lines 1008, 1009, 204—are in the above first state (e.g., "logic 0" (or—alternatively—"logic 1")).

Due to the above first state (e.g., "logic 0" (or—alternatively—"logic 1")) of the line 204, the switching device 201/transistor 201 is activated/switched on, and the voltage supply 205—and therefore, the voltage Uschalt—is electrically conductively coupled to the line 203.

Further, due to the above first state (e.g., "logic 0" (or—alternatively—"logic 1")) of the line 1009, the inverter 109a is deactivated/switched off, such that the inverter 109a does not evaluate the signal present on its input 109.

As is further illustrated in FIG. 4, during the above bit line charge time $t_1$, the bit line voltage Ubl continues to grow. At the end of the above bit line charge time $t_1$ (here: at the above time $t_{0,2}$), the value of the bit line voltage Ubl gets bigger, than the value of the further, predetermined voltage Upre present on line 1004b.

Therefore, the output of the additional operational amplifier 1004—and therefore, also the lines 1008, 1009, 204—changes from the above first state to the above second state (e.g., "logic 1" (or—alternatively—"logic 0")).

Due to the above second state (e.g., "logic 1" (or—alternatively—"logic 0")) of the line 204, the switching device 201/transistor 201 is deactivated/switched off, and the voltage supply 205—and therefore, the voltage Uschalt—is decoupled from the line 203.

Further, due to the above second state (e.g., "logic 1" (or—alternatively—"logic 0")) of the line 1009, the inverter 109a is activated/switched on, such that the inverter 109a as explained above starts to evaluate the signal present on its input 109.

In an additional alternative embodiment, the lines 1008, 1009, 204 (i.e., the switching device 201, and the inverter 109a) are not controlled by an operational amplifier 1004 as illustrated in FIG. 5/a signal generated by such operational amplifier 1004, but by a clock generator/a clock signal, e.g. by a clock signal which is in a predefined time relationship with regard to a clock signal used for evaluating the voltage $U_{DO}$ output at the output line 117.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory device, comprising:
    a bit line connected to a memory cell;
    at least one evaluation circuit configured to amplify a signal resulting from the reading of the memory cell, the evaluation circuit comprising:
        at least one current mirror device with a first and a second transistor, a gate of the first transistor coupled to a source or a drain of the first transistor; and
        an output of the evaluation circuit coupled to a source or a drain of the second transistor; and
    a device configured to precharge the output of the evaluation circuit to a selected voltage level based on a voltage level of the bit line as compared to a predetermined voltage level.

2. The memory device of claim 1, wherein the output of the evaluation circuit is connected to an inverter.

3. The memory device of claim 1, wherein an input of the evaluation circuit is connectable with the bit line connectable with the memory cell.

4. The memory device of claim 3, further comprising a device for precharging the bit line to a further predetermined voltage level.

5. The memory device of claim 1, wherein the evaluation circuit further comprises a second current mirror device with a third and fourth transistor, wherein:
a gate of the second transistor is coupled to the source or the drain of the first transistor;
the output of the evaluation circuit is coupled to a source or a drain of the fourth transistor;
a gate of the fourth transistor is coupled to a source or a drain of the third transistor; and
the source or the drain of the third transistor is coupled to a reference voltage source.

6. A memory device, comprising:
a bit line connected to a memory cell;
at least one evaluation circuit configured to amplify a signal resulting from the reading of the memory cell, the evaluation circuit comprising:
at least one current mirror device having a first and a second transistor, a gate of the first transistor coupled to a source or a drain of the first transistor; and
an output of the evaluation circuit coupled to a source or a drain of the second transistor; and
a device configured to precharge the output of the evaluation circuit to a selected voltage level based on a voltage level of the bit line as compared to a predetermined voltage level;
wherein the device for precharging the output comprises a precharge transistor for connecting/disconnecting a voltage source having the selected voltage level to/from the output of the evaluation circuit based on the voltage level of the bit line as compared to the predetermined voltage level.

7. The memory device of claim 6, additionally comprising:
a control device for controlling the precharge transistor such that in a first phase of the reading of the memory cell the output of the evaluation circuit is connected to the voltage source, and in a second phase of the reading of the memory cell the output of the evaluation circuit is disconnected from the voltage source.

8. The memory device of claim 7, wherein an input of the evaluation circuit is connectable with the bit line connectable with the memory cell, and wherein the control device compares the voltage level on the bit line with the predetermined voltage level.

9. The memory device of claim 8, wherein the output of the evaluation circuit is connected to the voltage source when the voltage level on the bit line is less than the predetermined voltage level, and the output of the evaluation circuit is disconnected from the voltage source when the voltage level on the bit line is at least equal to the predetermined voltage level.

10. The memory device of claim 8, wherein the output of the evaluation circuit is connected with an output device, and wherein the output device is deactivated when the voltage level on the bit line is less than the predetermined voltage level, and the output device is activated when the voltage level on the bit line is at least equal to the predetermined voltage level.

11. The memory device of claim 10, wherein the output device comprises an inverter.

12. The memory device of claim 8, wherein the control device comprises an operational amplifier.

13. The memory device of claim 9, further comprising:
a device for precharging the bit line to a further predetermined voltage level, wherein the further predetermined voltage level is bigger, than the predetermined voltage level.

14. The memory device of claim 13, wherein the device for precharging the bit line comprises an operational amplifier.

15. The memory device of claim 14, wherein the device for precharging the bit line comprises a transistor, coupled to the output of the operational amplifier.

16. The memory device of claim 1, wherein the memory cell is a non-volatile memory cell.

17. The memory device of claim 16, wherein the memory cell is a PROM, EPROM, EEPROM, flash, or OTP memory cell.

18. A chip with a memory device according to claim 1.

19. An apparatus for use with a memory device, comprising:
a sense amplifier comprising:
a first current mirror device with a first and a second transistor;
and a second current mirror device with a third and a fourth transistor, wherein a gate of the first transistor is coupled to a source-drain path of the second transistor, and a gate of the third transistor is coupled to a source-drain path of the fourth transistor, and an output of the sense amplifier is coupled to a source-drain path of the first transistor of the first current mirror device, and to a source-drain path of the third transistor of the second current mirror device; and
a device for precharging the output of the sense amplifier to a selected voltage level based on a voltage level of a bit line of a memory cell coupled to the sense amplifier as compared to a predetermined voltage level.

20. The apparatus of claim 19, wherein the device comprises:
a switch configured to connect the output of the sense amplifier to a voltage source at the selected voltage level in a first phase of the reading of the memory cell, and to disconnect the output of the sense amplifier from the voltage source in a second phase of the reading of the memory cell.

21. The apparatus of claim 20, wherein the switch comprises a transistor.

22. A method for operating a memory device, the method comprising:
amplifying a signal resulting from the reading of a memory cell using an evaluation circuit comprising at least one current mirror device having a first and a second transistor, a gate of the first transistor coupled to a source or a drain of the first transistor, and an output of the evaluation circuit coupled to a source or a drain of the second transistor; and
precharging the output of the evaluation circuit to a selected voltage level based on a voltage level of a bit line connected to the memory cell as compared to a predetermined voltage level using a device coupled to the source or the drain of the second transistor.

23. The method of claim 22, comprising:
connecting the output of the evaluation circuit to a voltage source having the selected voltage level in a first phase of the reading of the memory cell to precharge the output to the selected voltage level; and disconnecting the output of the evaluation circuit from the voltage source in a second phase of the reading of the memory cell.

24. The method of claim 23, wherein the memory device additionally comprises an output circuit coupled to the output of the evaluation circuit, the method comprising:
enabling or disabling the output circuit, or driving an output of the output circuit to a predetermined state.

25. A memory device, comprising:
a bit line connected to a memory cell;
at least one evaluation circuit means for amplifying a signal resulting from the reading of the memory cell comprising:
at least one current mirror device with a first and a second transistor, a gate of the first transistor coupled to a source or a drain of the first transistor; and
an output of the evaluation circuit means which is coupled to a source or a drain of the second transistor; and
means for precharging the output coupled to the source or the drain of the second transistor to a selected voltage level depending on a voltage level of the bit line as compared to a predetermined voltage level.

* * * * *